United States Patent
Lee

(10) Patent No.: US 11,715,749 B2
(45) Date of Patent: Aug. 1, 2023

(54) IMAGE SENSING DEVICE AND OPERATING METHOD THEREOF

(71) Applicant: SK hynix Inc., Gyeonggi-do (KR)

(72) Inventor: Dae Hyun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 27 days.

(21) Appl. No.: 17/096,566

(22) Filed: Nov. 12, 2020

(65) Prior Publication Data

US 2021/0399036 A1 Dec. 23, 2021

(30) Foreign Application Priority Data

Jun. 18, 2020 (KR) .................. 10-2020-0074264

(51) Int. Cl.
| | |
|---|---|
| *H04N 5/232* | (2006.01) |
| *H01L 27/146* | (2006.01) |
| *H04N 25/76* | (2023.01) |
| *H04N 25/62* | (2023.01) |
| *H04N 25/60* | (2023.01) |

(52) U.S. Cl.
CPC ....... *H01L 27/14621* (2013.01); *H04N 25/60* (2023.01); *H04N 25/62* (2023.01); *H04N 25/76* (2023.01)

(58) Field of Classification Search
None
See application file for complete search history.

(56) References Cited

U.S. PATENT DOCUMENTS

| | | | |
|---|---|---|---|
| 9,936,105 B2 | 4/2018 | Furuya | |
| 2005/0093992 A1* | 5/2005 | Fukumoto | G06T 5/003 348/222.1 |
| 2014/0152864 A1* | 6/2014 | Iha | H04N 23/88 348/223.1 |
| 2015/0071564 A1* | 3/2015 | Sasaki | G06T 5/002 382/275 |
| 2019/0306480 A1* | 10/2019 | Talagala | G06T 3/4015 |
| 2021/0067718 A1* | 3/2021 | Ito | H04N 25/589 |

* cited by examiner

*Primary Examiner* — Twyler L Haskins
*Assistant Examiner* — Wesley J Chiu
(74) *Attorney, Agent, or Firm* — IP & T Group LLP

(57) ABSTRACT

Disclosed is an image sensing device that includes an image sensor including a pixel array, the pixel array including arranged in a predetermined pattern a first group of pixels having a first color filter, a second group of pixels having a second color filter and a third group of pixels having a third color filter, and an image processor suitable for determining, based on pixel values outputted from the image sensor, whether a group having a minimum number of pixels among the first to third groups of pixels are supersaturated and correcting a pixel value of at least one supersaturated pixel according to a determination result.

18 Claims, 5 Drawing Sheets

FIG. 3A

| G00 | G01 | R02 | R03 |
|-----|-----|-----|-----|
| G10 | G11 | R12 | R13 |
| B20 | B21 | G22 | G23 |
| B30 | B31 | G32 | G33 |

FIG. 3B

| G00 | G01 | B02 | B03 |
|-----|-----|-----|-----|
| G10 | G11 | B12 | B13 |
| R20 | R21 | G22 | G23 |
| R30 | R31 | G32 | G33 |

FIG. 3C

| R00 | R01 | G02 | G03 |
|-----|-----|-----|-----|
| R10 | R11 | G12 | G13 |
| G20 | G21 | B22 | B23 |
| G30 | G31 | B32 | B33 |

FIG. 3D

| B00 | B01 | G02 | G03 |
|-----|-----|-----|-----|
| B10 | B11 | G12 | G13 |
| G20 | G21 | R22 | R23 |
| G30 | G31 | R32 | R33 |

IMAGE SENSING DEVICE AND OPERATING METHOD THEREOF

CROSS-REFERENCE TO RELATED APPLICATION(S)

This application claims priority under 35 U.S.C. § 119 to Korean Patent Application No. 10-2020-0074264, filed on Jun. 18, 2020, the entire disclosure of which is incorporated herein by reference in its entirety.

BACKGROUND

1. Field

Various embodiments of the present disclosure relate generally to semiconductor design and, more particularly, to an image sensing device and an operating method thereof.

2. Description of the Related Art

Image sensing devices capture images by using a semiconductor property which reacts to light. Image sensing devices may be roughly classified into charge-coupled device (CCD) image sensing devices and complementary metal-oxide semiconductor (CMOS) image sensing devices. Recently, CMOS image sensing devices are widely used because the CMOS image sensing devices allow both analog and digital control circuits to be directly implemented on a single integrated circuit (IC).

SUMMARY

Various embodiments of the present disclosure are directed to an image sensing device that is capable of correcting a pixel value of a supersaturated pixel, and an operating method of the image sensing device.

In accordance with an embodiment, an image sensing device may include: an image sensor including a pixel array, the pixel array including arranged in a predetermined pattern a first group of pixels having a first color filter, a second group of pixels having a second color filter and a third group of pixels having a third color filter; and an image processor suitable for determining, based on pixel values outputted from the image sensor, whether a group having a minimum number of pixels among the first to third groups of pixels are supersaturated and correcting a pixel value of at least one supersaturated pixel according to a determination result.

The image processor may determine whether the group having the minimum number of pixels are supersaturated based on pixel values of the group having the minimum number of pixels and pixel values of a group having a maximum number of pixels among the first to third groups.

In accordance with an embodiment, an image sensing device may include: an image sensor including a pixel array in which a first group of pixels having a red color filter, a second group of pixels having a blue color filter and a third group of pixels having a green color filter are arranged in a first pattern; and an image processor suitable for generating an image having a second pattern based on pixel values outputted from the image sensor, wherein the image processor is further suitable for correcting, when generating the image, a pixel value of each supersaturated pixel among the first and second groups based on a pixel value of at least the third group arranged closest to the supersaturated pixel.

A ratio of numbers of the pixels within the respective first to third groups is 1:1:2.

The first pattern may include a quad pattern, and the second pattern may include a Bayer pattern.

In accordance with an embodiment, an operating method of an image sensing device may include: firstly determining whether a target pixel is supersaturated based on a pixel value of the target pixel among a first group of pixels having a first color filter and a pixel value of at least one peripheral pixel arranged closest to the target pixel among a second group of pixels having a second color filter; secondly determining whether the target pixel is supersaturated based on the pixel value of the target pixel and a pixel value of at least one peripheral pixel arranged closest to the target pixel among the first group; and correcting the pixel value of the target pixel according to results obtained by firstly and secondly determining whether the target pixel is supersaturated.

The correcting of the pixel value of the target pixel may include correcting the pixel value of the target pixel when both of the results indicate the supersaturation of the target pixel.

The correcting of the pixel value of the target pixel may include correcting the pixel value of the target pixel based on the pixel value of the target pixel and the pixel value of the peripheral pixel included in the second group.

In accordance with an embodiment, an operating method of an image sensing device may include: generating pixel values from a quad-patterned pixel array; detecting, based on one or more of conditions 1 and 2, supersaturated pixel values of one or more pixel groups among the pixel values, each group being of one or more of first and second filters; correcting the supersaturated pixel values based on equations 3 to 6; and generating a bayer-patterned image based on at least the corrected pixel values, wherein:

$$TP > \frac{G1 + G2 + G3 + G4}{4}, \quad \text{[Condition 1]}$$

wherein "TP" is an average pixel value of a target pixel group and "G1" to "G4" are average pixel values of respective green pixel groups peripheral to the target pixel group, $$TP > \alpha * \left(\frac{T1 + T2 + T3 + T4}{4}\right), \quad \text{[Condition 2]}$$

wherein "α" is a supersaturation constant and "T1" to "T4" are average pixel values of respective color pixel groups that are of the same color filter as the target pixel group and peripheral to the target pixel group, and $$P1' = P1 * \left(\frac{G1 + G2 + G3 + G4}{4 * TP}\right), \quad \text{[Equation 3]}$$

$$P2' = P2 * \left(\frac{G1 + G2 + G3 + G4}{4 * TP}\right), \quad \text{[Equation 4]}$$

$$P3' = P3 * \left(\frac{G1 + G2 + G3 + G4}{4 * TP}\right), \text{ and} \quad \text{[Equation 5]}$$

$$P4' = P4 * \left(\frac{G1 + G2 + G3 + G4}{4 * TP}\right), \quad \text{[Equation 6]}$$

wherein "P1" to "P4" are the supersaturated pixel values of respective pixels within the target pixel group and "P1'"

to "P4'" are the corrected pixel values of the respective supersaturated pixel values "P1" to "P4".

These and other features and advantages of the present invention will become clear to those with ordinary skill in the art of the invention from the following detailed description and figures.

BRIEF DESCRIPTION OF THE DRAWINGS

FIGS. 3A to 3D are configuration diagrams illustrating examples of a pixel array shown in FIG. 2.

DETAILED DESCRIPTION

Various embodiments are described below with reference to the accompanying drawings, in order to describe in detail the present disclosure to those with ordinary skill in the art to which the present disclosure pertains to easily carry out the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification, specify the presence of the stated elements and do not preclude the presence or addition of one or more other elements. In the description throughout the specification, some components are described in singular forms, but the present disclosure is not limited thereto, and it will be understood that the components may be formed in plural.

Figure 1:
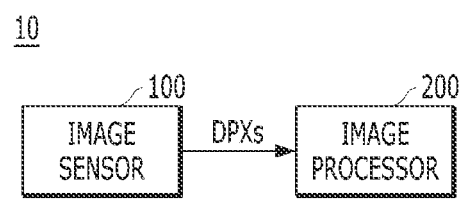
FIG. 1 is a block diagram illustrating an image sensing device including an image sensor and an image processor in accordance with an embodiment of the present disclosure.

FIG. 1 is a block diagram illustrating an image sensing device designated with numeral 10, in accordance with an embodiment of the present disclosure.

Referring to FIG. 1, the image sensing device 10 may include an image sensor 100 and an image processor 200 operatively coupled to each other.

The image sensor 100 may generate a plurality of pixel signals DPXs corresponding to incident light. For example, the image sensor 100 may generate the pixel signals DPXs corresponding to an image having a quad pattern.

The image processor 200 may generate an image based on the pixel signals DPXs. For example, the image processor 200 may generate an image having a Bayer pattern. Particularly, when generating the image having the Bayer pattern, the image processor 200 may determine whether target pixels among a plurality of pixels included in the image sensor 100 are supersaturated, and correct supersaturated pixels according to a determination result.

Figure 2:
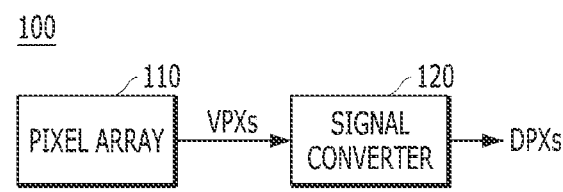
FIG. 2 is a block diagram illustrating an example of the image sensor employed in the image sensing device of FIG. 1.

FIG. 2 is a block diagram illustrating the image sensor 100 shown in FIG. 1.

Referring to FIG. 2, the image sensor 100 may include a pixel array 110 and a signal converter 120 operatively coupled to each other.

The pixel array 110 may include a plurality of pixels. The pixels may be arranged in rows and columns. The plurality of pixels may be arranged in a quad pattern such as the one shown in FIG. 3. The pixel array 110 may generate a plurality of pixel signals VPXs for each row. For example, the pixel array 110 may generate the pixel signals VPXs from pixels arranged in a first row during a first row time, and generate pixel signals VPXs from pixels arranged in an $n^{th}$ row during an $n^{th}$ row time (where "n" is a natural number greater than 2). Each of the pixel signals VPXs may be an analog-typed pixel signal.

The signal converter 120 may convert the analog-typed pixel signals VPXs into digital-typed pixel signals DPXs. For example, the signal converter 120 may include an analog to digital converter.

FIGS. 3A to 3D configuration diagrams illustrating examples of the pixel array 110 shown in FIG. 2.

Referring to FIGS. 3A to 3D, the pixel array 110 may include the plurality of pixels arranged in the quad pattern. The quad pattern refers to a pattern in which four pixels having the same color filter are arranged in units of groups, each having 2×2 pixels, and a color arrangement is repeated in units of patterns, each having 4×4 pixels or 2×2 groups.

In an example A, the quad pattern may have a structure in which four pixels G00, G01, G10 and G11 having a green color filter are arranged as the group in the upper left corner, four pixels R02, R03, R12 and R13 having a red color filter are arranged as the group in the upper right corner, four pixels B20, B21, B30 and B31 having a blue color filter are arranged as the group in the lower left corner, and four pixels G22, G23, G32 and G33 having a green color filter are arranged as the group in the lower right corner.

In an example B, the quad pattern may have a structure in which four pixels G00, G01, G10 and G11 having a green color filter are arranged as the group in the upper left corner, four pixels B02, B03, B12 and B13 having a blue color filter are arranged as the group in the upper right corner, four pixels R20, R21, R30 and R31 having a red color filter are arranged as the group in the lower left corner, and four pixels G22, G23, G32 and G33 having a green color filter are arranged as the group in the lower right corner.

In an example C, the quad pattern may have a structure in which four pixels R00, R01, R10 and R11 having a red color filter are arranged as the group in the upper left corner, four pixels G02, G03, G12 and G13 having a green color filter are arranged as the group in the upper right corner, four pixels G20, G21, G30 and G31 having a green color filter are arranged as the group in the lower left corner, and four pixels B22, B23, B32 and B33 having a blue color filter are arranged as the group in the lower right corner.

In an example D, the quad pattern may have a structure in which four pixels B00, B01, B10 and B11 having a blue color filter are arranged as the group in the upper left corner, four pixels G02, G03, G12 and G13 having a green color filter are arranged as the group in the upper right corner, four pixels G20, G21, G30 and G31 having a green color filter are arranged as the group in the lower left corner, and four pixels R22, R23, R32 and R33 having a red color filter are arranged as the group in the lower right corner.

Herein, it may be seen that the ratio of the number of pixels having the red color filter (hereinafter referred to as "red pixels"), the number of pixels having the blue color filter (hereinafter referred to as "blue pixels") and the number of pixels having the green color filter (hereinafter referred to as "green pixels") is 1:1:2 within the unit of 4×4 pixels or 2×2 groups. That is, pixels having a minimum number of pixels among the plurality of pixels may be the red pixels and the blue pixels, and pixels having a maximum number of pixels among the plurality of pixels may be the green pixels. The plurality of pixels may be supersaturated in units of the groups (i.e., pixels arranged as the groups) according to characteristics. In the present embodiment, it is possible to determine whether a relatively small number of the red and blue pixels is supersaturated and correct the supersaturated pixels. Hereinafter, the embodiment describes an example of determining whether the red and blue pixels are supersaturated in units of the patterns, each of 2×2 groups.

Figure 4:
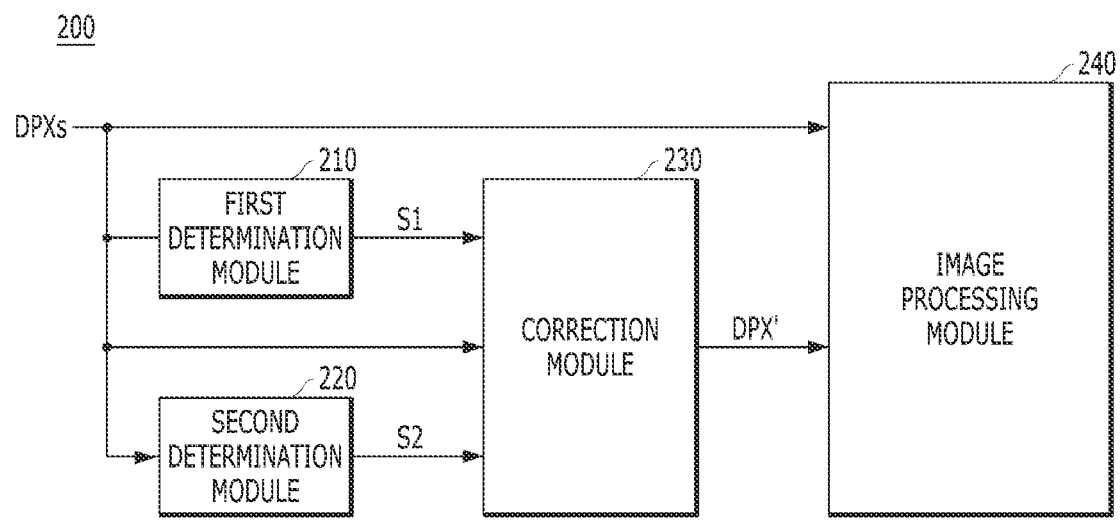
FIG. 4 is a block diagram illustrating an example of the image processor employed in the image sensing device of FIG. 1.

FIG. 4 is a block diagram illustrating the image processor 200 shown in FIG. 1.

Referring to FIG. 4, the image processor 200 may include a first determination module 210, a second determination module 220, a correction module 230 and an image processing module 240.

The first determination module 210 may firstly determine whether the red and blue pixels are supersaturated, based on the pixel signals DPXs. For example, the first determination module 210 may determine whether a target pixel group is supersaturated, based on pixel values of the target pixel group among the red and blue pixels and pixel values of first to fourth peripheral green pixel groups arranged closest to the target pixel group among the green pixels. The first determination module 210 may determine that the target pixel group has been supersaturated when the target pixel group satisfies the following Condition 1.

$$TP > \frac{G1 + G2 + G3 + G4}{4} \qquad \text{[Condition 1]}$$

Herein, "TP" may denote an average value of the pixel values of the target pixel group, "G1" may denote an average value of the pixel values of the first peripheral green pixel group, "G2" may denote an average value of the pixel values of the second peripheral green pixel group, "G3" may denote an average value of the pixel values of the third peripheral green pixel group, and "G4" may denote an average value of the pixel values of the fourth peripheral green pixel group.

That is, the first determination module 210 may determine that the target pixel group has been supersaturated when the average value TP of the target pixel group is greater than an average value of the average values G1, G2, G3 and G4 of the first to fourth peripheral green pixel groups. The first determination module 210 may provide a result S1 of the determination to the correction module 230.

The second determination module 220 may secondly determine whether the red and blue pixels are supersaturated, based on the pixel signals DPXs. For example, the second determination module 220 may determine whether the target pixel group is supersaturated, based on the pixel values of the target pixel group and pixel values of first to fourth peripheral color pixel groups arranged closest to the target pixel group among pixel groups having the same color filter as the target pixel group. The second determination module 220 may determine that the target pixel group has been supersaturated when the target pixel group satisfies the following Condition 2.

$$TP > \alpha * \left(\frac{T1 + T2 + T3 + T4}{4}\right) \qquad \text{[Condition 2]}$$

Herein, "TP" may denote an average value of the pixel values of the target pixel group, "T1" may denote an average value of the pixel values of the first peripheral color pixel group that is of the same color filter as the target pixel group, "T2" may denote an average value of the pixel values of the second peripheral color pixel group that is of the same color filter as the target pixel group, "T3" may denote an average value of the pixel values of the third peripheral color pixel group that is of the same color filter as the target pixel group, and "T4" may denote an average value of the pixel values of the fourth peripheral color pixel group that is of the same color filter as the target pixel group.

That is, the second determination module 220 may determine that the target pixel group has been supersaturated when the average value TP of the target pixel group is greater than a calculation value of the average values T1, T2, T3 and T4 of the first to fourth peripheral color pixel groups. The calculation value may include a value obtained by multiplying an average value of the average values T1, T2, T3 and T4 of the first to fourth peripheral color pixel groups by a supersaturation constant "α". When the supersaturation constant "α" is "3", the second determination module 220 may determine that the target pixel group has been supersaturated when the average value TP of the target pixel group is greater than the calculation value corresponding to three times (α=3) the average value of the average values T1, T2, T3 and T4 of the first to fourth peripheral color pixel groups. The second determination module 220 may provide a result S2 of the determination to the correction module 230.

Although the present embodiment describes an example in which the first and second determination modules 210 and 220 are configured to increase accuracy when determining whether the target pixel group is supersaturated, the present disclosure is not necessarily limited thereto, and any one of the first and second determination modules 210 and 220 may be configured depending on design.

The correction module 230 may correct the pixel values of the target pixel group according to the determination results S1 and S2 of the first and second determination modules 210 and 220. The correction module 230 may correct the supersaturated pixel values of the target pixel group based on the following Equations 3 to 6.

$$P1' = P1 * \left(\frac{G1 + G2 + G3 + G4}{4 * TP}\right) \qquad \text{[Equation 3]}$$

$$P2' = P2 * \left(\frac{G1 + G2 + G3 + G4}{4 * TP}\right) \qquad \text{[Equation 4]}$$

$$P3' = P3 * \left(\frac{G1 + G2 + G3 + G4}{4 * TP}\right) \qquad \text{[Equation 5]}$$

$$P4' = P4 * \left(\frac{G1 + G2 + G3 + G4}{4 * TP}\right) \qquad \text{[Equation 6]}$$

Herein, "P1" may denote a supersaturated pixel value of a first pixel among first to fourth pixels included in the target pixel group, "P2" may denote a supersaturated pixel value of the second pixel among the first to fourth pixels included in the target pixel group, "P3" may denote a supersaturated pixel value of the third pixel among the first to fourth pixels included in the target pixel group, "P4" may denote a supersaturated pixel value of the fourth pixel among the first to fourth pixels included in the target pixel group, "P1'" may denote a corrected first pixel value corresponding to the first supersaturated pixel value "P1", "P2'" may denote a corrected second pixel value corresponding to the second supersaturated pixel value "P2", "P3'" may denote a corrected third pixel value corresponding to the third supersaturated pixel value "P3", and "P4'" may denote a corrected fourth pixel value corresponding to the fourth supersaturated pixel value "P4". "TP", "G1", "G2", "G3" and "G4" may be the same as the respective average values described above.

That is, when both the determination results S1 and S2 of the first and second determination modules 210 and 220 indicate the supersaturation of the target pixel group, the correction module 230 may correct the supersaturated pixel values P1, P2, P3 and P4 of the first to fourth target pixels included in the target pixel group, and generate the corrected first to fourth pixel values P1', P2', P3' and P4'. The correction module 230 may correct the supersaturated pixel values P1, P2, P3 and P4 of the first to fourth target pixels based on the average value TP of the target pixel group and the average values G1, G2, G3 and G4 of the first to fourth peripheral green pixel groups. More specifically, the correction module 230 may generate the corrected first to fourth pixel values P1', P2', P3' and P4' by multiplying the ratio between a value corresponding to four times the average value TP of the target pixel group and a sum value of the average values G1, G2, G3 and G4 of the first to fourth peripheral green pixel groups by the respective supersaturated pixel values P1, P2, P3 and P4 of the first to fourth target pixels. Accordingly, the pixel values of the supersaturated target pixel group may be corrected to a level corresponding to the average values of the first to fourth peripheral green pixel groups that are not saturated.

The image processing module 240 may generate the image having the Bayer pattern based on the pixel signals DPXs and a corrected value DPX' generated from the correction module 230. The corrected value DPX' may include the corrected first to fourth pixel values P1', P2', P3' and P4'.

Hereinafter, an operation of the image sensing device in accordance with the present embodiment, which has the above-described configuration, will be described.

Figure 5:
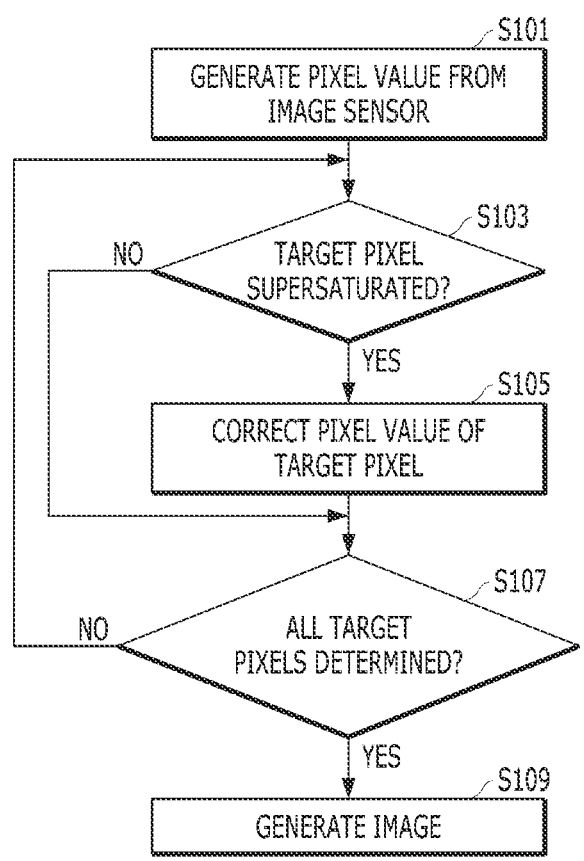
FIG. 5 is a flowchart illustrating an operation of the image sensing device shown in FIG. 1 according to an embodiment of the present disclosure.

FIG. 5 is a flowchart illustrating the operation of the image sensing device according to an embodiment of the present disclosure.

Referring to FIG. 5, the image sensor 100 may generate the pixel signals DPXs corresponding to incident light, in operation S101. For example, each of the pixel signals DPXs may include a digital-type pixel value.

The image processor 200 may determine whether the target pixel group is supersaturated among the plurality of pixels, based on the pixel signals DPXs, in operation S103. For example, the first determination module 210 may firstly determine whether the red and blue pixels among the plurality of pixels are supersaturated, and the second determination module 220 may secondly determine whether the red and blue pixels among the plurality of pixels are supersaturated.

At this time, the first determination module 210 may determine whether the target pixel group is supersaturated, based on the above-described Condition 1, and the second determination module 220 may determine whether the target pixel group is supersaturated, based on the above-described Condition 2.

The image processor 200 may correct the pixel values of the target pixel group according to the determination results S1 and S2 of the first and second determination modules 210 and 220, in operation S105. For example, when both the determination results S1 and S2 of the first and second determination modules 210 and 220 indicate the supersaturation of the target pixel group, the correction module 230 may correct the pixel values of the target pixel group based on the above-described Equations 3 to 6.

The image processor 200 may determine whether each of all the target pixel groups is supersaturated, with respect to the red and blue pixels in operation S107. When all of the target pixel groups have not yet been determined whether they have supersaturation, operations S103 to S107 may be repeated on any remaining target pixel groups.

The image processor 200 may generate the image based on the pixel signals DPXs generated from the image sensor 100 and the corrected value DPX' generated from the correction module 230, in operation S109. For example, the image processing module 240 may generate the image having the Bayer pattern based on the pixel signals DPXs corresponding to the quad pattern and the corrected value DPX'.

Figure 6:
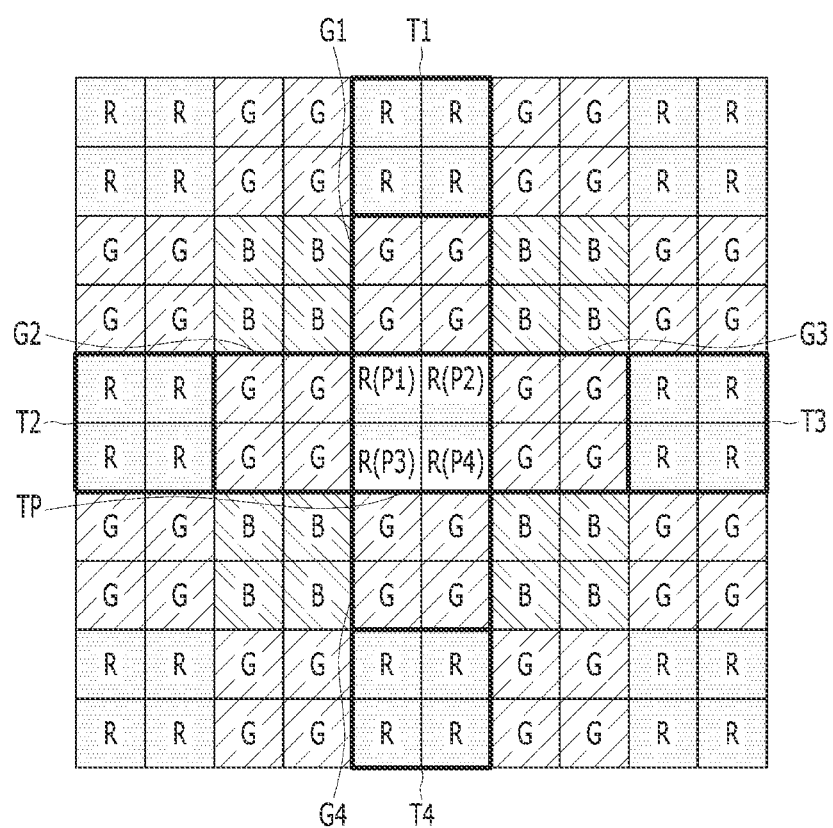
FIG. 6 is a diagram additionally illustrating the operation of the image sensing device shown in FIG. 5 according to an embodiment of the present disclosure.

FIG. 6 is a diagram illustrating an example of the quad pattern for additionally describing the operation of the image sensing device shown in FIG. 5. FIG. 6 illustrates an operation of the image processor 200 by taking, as a representative example, any one target pixel group of the red pixels.

The first determination module 210 may determine whether the target pixel group is supersaturated, based on the average value TP of the target pixel group among the red pixels and the average values G1, G2, G3 and G4 of the first to fourth peripheral green pixel groups, arranged closest to the target pixel group, among the green pixels. For example, the first determination module 210 may determine that the target pixel group has been supersaturated when the target pixel group satisfies the above-described Condition 1.

The second determination module 220 may determine whether the target pixel group is supersaturated based on the average value TP of the target pixel group and the average values T1, T2, T3 and T4 of the first to fourth peripheral red pixel groups arranged closest to the target pixel group. The first to fourth peripheral red pixel groups and the target pixel group may be of the same color filter (e.g., the red filter). For example, the second determination module 220 may determine that the target pixel group has been supersaturated when the target pixel group satisfies the above-described Condition 2.

The correction module 230 may correct the pixel values of the target pixel group when both the determination results S1 and S2 of the first and second determination modules 210 and 220 indicate the supersaturation of the target pixel group. For example, the correction module 230 may generate the corrected first to fourth pixel values P1', P2', P3' and P4' by multiplying the ratio between the value corresponding to four times the average value TP of the target pixel group and the sum value of the average values G1, G2, G3 and G4 of the first to fourth peripheral green pixel groups by the respective supersaturated pixel values P1, P2, P3 and P4 of the first to fourth target pixels, based on the above-described Equations 3 to 6.

According to an embodiment of the present disclosure, it is possible to easily determine a supersaturated pixel and easily correct a pixel value of the supersaturated pixel by using pixel values of peripheral pixels. In addition, since pixels arranged in a quad pattern are corrected at a uniform ratio for each pattern, it is possible to maintain texture.

According to an embodiment of the present disclosure, a pixel value of a supersaturated pixel may be corrected, thereby generating a normal image.

While the present disclosure has been illustrated and described with respect to specific embodiment, the disclosed embodiment is provided for the description, and is not intended to be restrictive. Further, it is noted that the present disclosure may be achieved in various ways through substitution, change, and modification that fall within the scope of the following claims, as those skilled in the art will recognize in light of the present disclosure.

What is claimed is:

1. An image sensing device comprising:
    an image sensor including a pixel array, the pixel array including arranged in a predetermined pattern a first group of pixels having a first color filter, a second group of pixels having a second color filter and a third group of pixels having a third color filter; and
    an image processor suitable for
    generating an image based on pixel values outputted from the image sensor,
    first determining whether a target pixel of the first group having a minimum number of pixels among the first to third groups of pixels is supersaturated based on a target pixel value of the target pixel and first pixel values first of peripheral pixels adjacent to the first group containing the target pixel, wherein the first peripheral pixels have a different color filter from the first group containing the target pixel,
    second determining whether the target pixel value of the target pixel of the first group is supersaturated based on the target pixel value and second pixel values of second peripheral pixels adjacent to the first peripheral pixels, wherein the second peripheral pixels are farther from the target pixel than the first peripheral pixels, and the second peripheral pixels have a same color filter as the target pixel of the first group, and
    correcting, according to results of the first and second determining, a supersaturated pixel value of at least one supersaturated pixel by using a ratio between the supersaturated pixel value and at least one pixel value of a first pixel values.

2. The image sensing device of claim 1, wherein the image processor includes:
    a first determination module suitable for determining whether the target pixel is supersaturated based on the pixel value of the target pixel within the first group and the first pixel values of the first peripheral pixels;
    a second determination module suitable for determining whether the target pixel is supersaturated based on the pixel value of the target pixel and pixel values of the second peripheral pixels; and
    a correction module suitable for correcting the pixel value of the target pixel according to determination results of the first and second determination modules.

3. The image sensing device of claim 2, wherein the first determination module determines that the target pixel has been supersaturated when the pixel value of the target pixel is greater than an average pixel value of the pixels of the first peripheral pixels.

4. The image sensing device of claim 2, wherein the second determination module determines that the target pixel has been supersaturated when the pixel value of the target pixel is greater than a calculation value of the pixel values of the second peripheral pixels.

5. The image sensing device of claim 4, wherein the calculation value includes a value obtained by multiplying an average pixel value of the second peripheral pixels by a supersaturation constant.

6. The image sensing device of claim 2, wherein the correction module corrects the pixel value of the target pixel when both the determination results of the first and second determination modules indicate the supersaturation of the target pixel.

7. The image sensing device of claim 2, wherein the correction module corrects the pixel value of the target pixel based on the pixel value of the target pixel and the pixel values of the second peripheral pixels.

8. An image sensing device comprising:
    an image sensor including a pixel array in which a first group of pixels having a red color filter, a second group of pixels having a blue color filter and a third group of pixels having a green color filter are arranged in a first pattern; and
    an image processor suitable for
    generating an image having a second pattern based on pixel values outputted from the image sensor,
    firstly determining whether a target pixel is supersaturated based on a pixel value of the target pixel among the first and second group and at least one pixel value of a set of green peripheral pixels arranged closest to and adjacent the target pixel;
    secondly determining whether the target pixel is supersaturated based on the pixel value of the target pixel and at least one pixel value of one set of a set of red peripheral pixels and a set of blue peripheral pixels arranged closest to the target pixel, and
    correcting, when generating the image, a pixel value of a supersaturated pixel among the first or second groups by using a ratio between the pixel value of the supersaturated pixel and at least one pixel value of a first peripheral group of green pixels of the third group arranged closest to and adjacent the supersaturated pixel.

9. The image sensing device of claim 8, wherein a ratio of numbers of the pixels within the respective first to third groups is 1:1:2.

10. The image sensing device of claim 8, wherein the first pattern includes a quad pattern, and the second pattern includes a Bayer pattern.

11. The image sensing device of claim 8, wherein the image processors includes:
    a first determination module suitable for determining whether the target pixel is supersaturated based on the pixel value of the target pixel within the first and second groups and pixel values of the first peripheral group of pixels arranged closest to the target pixel, among the third groups;
    a second determination module suitable for determining whether the target pixel is supersaturated based on the pixel value of the target pixel and pixel values of a second peripheral group of pixels arranged closest to the target pixel, the second peripheral group having the same color filter as the target pixel; and
    a correction module suitable for correcting the pixel value of the target pixel according to determination results of the first and second determination modules.

12. The image sensing device of claim 11, wherein the first determination module determines that the target pixel has been supersaturated when the pixel value of the target pixel is greater than an average pixel value of the pixels of the first peripheral group.

13. The image sensing device of claim 11, wherein the second determination module determines that the target pixel has been supersaturated when the pixel value of the target pixel is greater than a calculation value of the pixel values of the second peripheral group.

14. The image sensing device of claim 13, wherein the calculation value includes a value obtained by multiplying an average pixel value of the pixels of the second peripheral group by a supersaturation constant.

15. The image sensing device of claim 11, wherein the correction module corrects the pixel value of the target pixel when both the determination results of the first and second determination modules indicate the supersaturation of the target pixel.

16. An operating method of an image sensing device, comprising:
generating first values of a first group of pixels having a red color filter, second values of a second group of pixels having a blue color filter and third values of a third group of pixels having a green color filter;
firstly determining whether a target pixel is supersaturated based on a pixel value of the target pixel among the first and second group and at least one pixel value of a set of green peripheral pixels arranged closest to and adjacent the target pixel;
secondly determining whether the target pixel is supersaturated based on the pixel value of the target pixel and at least one pixel value of one set of a set of red peripheral pixels and a set of blue peripheral pixels arranged closest to the target pixel; and
correcting, according to results obtained by firstly and secondly determining whether the target pixel is supersaturated, the pixel value of the target pixel by using a ratio between the pixel value of the target pixel and at least one pixel value of at least one pixel of the green peripheral pixels arranged closest to and adjacent the target pixel.

17. The operating method of claim 16, wherein the correcting of the pixel value of the target pixel includes correcting the pixel value of the target pixel when both of the results indicate the supersaturation of the target pixel.

18. The operating method of claim 16, wherein the correcting of the pixel value of the target pixel includes correcting the pixel value of the target pixel based on the pixel value of the target pixel and the at least one pixel value of the set of green peripheral pixels.

* * * * *